United States Patent [19]

Macris et al.

[11] Patent Number: 5,286,304

[45] Date of Patent: Feb. 15, 1994

[54] THERMOELECTRIC DEVICE AND METHOD OF MANUFACTURING

[75] Inventors: Chris Macris; John D. Anderson, both of North Bend, Wash.

[73] Assignee: Enerdyne Corporation, North Bend, Wash.

[21] Appl. No.: 782,289

[22] Filed: Oct. 24, 1991

[51] Int. Cl.$^5$ .............................................. H01L 35/34
[52] U.S. Cl. .................... 136/201; 136/205; 136/211; 136/212; 136/225
[58] Field of Search ............... 136/200, 201, 205, 211, 136/212, 224, 225; 156/630, 660, 661.1, 666, 247

[56] References Cited

U.S. PATENT DOCUMENTS

| Re. 29,820 | 10/1978 | Konicek | 156/630 |
|---|---|---|---|
| 2,519,785 | 8/1950 | Okolicsanyi | 136/4 |
| 2,747,977 | 5/1956 | Eisler | 41/43 |
| 3,018,311 | 1/1962 | Bagno et al. | 136/4 |
| 3,335,043 | 8/1967 | Joerren et al. | 156/269 |
| 3,671,327 | 6/1972 | Gay | 136/225 |
| 3,900,603 | 8/1975 | Rittmayer et al. | 427/124 |
| 4,190,474 | 2/1980 | Berdan et al. | 156/151 |
| 4,343,960 | 8/1982 | Eguchi et al. | 136/225 |
| 4,817,436 | 4/1989 | Sallée et al. | 73/708 |

FOREIGN PATENT DOCUMENTS 1357217  6/1974  United Kingdom ............... 136/225

*Primary Examiner*—Donald P. Walsh
*Assistant Examiner*—Chrisman D. Carroll
*Attorney, Agent, or Firm*—Jensen & Puntigam

[57] ABSTRACT

A method of manufacturing a thermoelectric device including the steps of printing a patterned mask on both sides of a strip of copper foil, shielding one side and plating a pattern of nickel on the other side, removing the shield, securing the foil to a flexible film and etching copper from predesignated areas, creating the thermoelectric device.

1 Claim, 2 Drawing Sheets

THERMOELECTRIC DEVICE AND METHOD OF MANUFACTURING

TECHNICAL FIELD

This invention relates to a thermoelectric generator and the method of manufacturing the same, and, more particularly, to a method of manufacturing a thermoelectric generator which is thin and flexible and therefore capable of being formed into a continuous coil enabling the generation of a substantial amount of current with a compact unit.

BACKGROUND ART

It has been known since the early 1800s that when two dissimilar conductors are joined into a loop and a temperature differential is maintained between the two end junctions, an electromotive force is generated causing a current to flow.

Since the time of this discovery, various combinations of material, configurations of units and/or sizes have allowed this principle to be utilized to use heat to generate electricity having a twofold effect, i.e., removing heat from where it is often not wanted and creating an electromotive force which likewise can be used for its obvious benefit. By reversing the process, an electric current can be applied to the thermocouple causing the unit to serve as a cooling device.

The early devices were fabricated of hardware, such as hard wire and other physically large components, but it was determined that the principle likewise should work on a smaller scale. The devices were manufactured using electrodepositing, etching and similar methods producing devices which continued to function as predicted, but of a much smaller size. Obviously the size of the device, the material from which it is manufactured, the number of units, and certainly the difference in temperature between the two junctions will each determine independently the amount of power that is generated. Obviously an optimal combination should exist.

Prior art known by the present inventor include U.S. Pat. No. 3,018,312 granted to Cornish et al, Jan. 3, 1962 which discloses a plurality of materials used for thermoelectrical conductors.

U.S. Pat. No. 3,051,767 granted to Frederick et al, Aug. 28, 1962 discloses thermoelectric devices and thermoelements.

U.S. Pat. No. 3,057,940 granted to Fritts Oct. 9, 1962 discloses a thermoelectric generator of a particular structure, such that the expansion or contraction of the elements caused by the temperature changes is minimized.

U.S. Pat. No. 3,090,206 granted to Anders May 21, 1963 discloses thermoelectric devices and circuits therefor, including specific structure to improve the efficiency thereof.

U.S. Pat. No. 3,279,954 granted to Cody et al, Oct. 18, 1966 discloses a thermoelectric device, including a silicon germanium alloy element.

U.S. Pat. No. 3,400,452 granted to Emley Sep. 10, 1968 discloses a method of producing tubular thermoelectric devices reducing the damage to the elements caused by mechanical deformation during fabrication.

U.S. Pat. No. 3,554,815 granted to Osborn Jan. 12, 1971 discloses a thin thermoelectric device, including a thin flexible nonconductive film having noncontacting bands on opposite sides of a film in conductive electrical association.

U.S. Pat. No. 3,723,189 granted to Zahn Mar. 27, 1973 discloses a staged thermoelectric device, wherein the segments of each stage are connected thermally in parallel and interconnected thermally in series at the stage level.

U.S. Pat. No. 3,900,603 granted to Rittmayer et al, Aug. 19, 1975 discloses a method for producing a thermoelectric generator by vapor depositing a semiconductor compound.

U.S. Pat. No. 4,095,998 granted to Hanson Jun. 20, 1978 discloses a thermoelectric voltage generator specifically designed to absorb the heat from an automobile exhaust system, generating electricity for use in the vehicle.

U.S. Pat. No. 4,251,290 granted to Gomez Feb. 17, 1981 discloses a thermopile formed of conductor elements, wherein the junctions are of a large cross section increasing the efficiency of the unit.

U.S. Pat. No. 4,257,822 granted to Gomez Mar. 24, 1981 discloses a continuous thermopile of a repetitive shape manufactured by a plating process.

U.S. Pat. No. 4,276,441 granted to Wilson Jun. 30, 1981 discloses a thermoelectric generator fabricated of printed conductive ink upon a suitable substrate.

U.S. Pat. No. 4,343,960 granted to Eguchi et al, Aug. 10, 1982 discloses a thermopile fabricated by a photoetching technique.

U.S. Pat. No. 4,438,291 granted to Eichelberger et al, Mar. 20, 1984 discloses a low cost thermocouple fabricated by a screen printing technique.

U.S. Pat. No. 4,444,991 granted to Beale on Apr. 24, 1984 discloses a high efficiency thermopile, wherein the junction of dissimilar materials at the higher temperature is of a larger than normal cross section of the elements at the lower temperature. The device is manufactured utilizing a thin film technology.

U.S Pat. No. 4,459,428 granted to Chou on Jul. 10, 1984 discloses a thermoelectric device, wherein thermocouples are disposed between a pair of copper plate segments having a thin film ceramic insulator.

DISCLOSURE OF THE INVENTION

With the above-noted prior art and technology in mind, it is an object of the present invention to provide a much smaller thermoelectric device manufactured by a novel manufacturing technique.

It is another object of the present invention to provide a thermoelectric device, wherein the material forming the device is sufficiently flexible that the configuration of the resultant unit fabricated of a plurality of the devices is substantially unlimited.

It is still a further object of the present invention to provide a thermoelectric device comprising of a plurality of thermoelectric generators in series, and the entire device is coiled tightly permitting the maximum generation of electricity in the minimum amount of space and with a minimum of heat differential.

Yet a further object of the present invention is to provide a thermoelectric device which may be fabricated by a semiautomated process reducing the cost of manufacture.

Yet a further object of the present invention is to provide a thermoelectric device, wherein the device may be tailored, i.e., cut to length to predetermine the output.

BEST MODE FOR CARRYING OUT THE INVENTION

Figure 1:
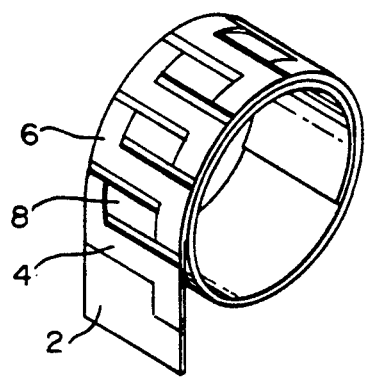
FIG. 1 is a pictorial representation of one thermoelectric device capable of being fabricated utilizing thermoelectric units manufactured by the inventive technique.
Figure 2:
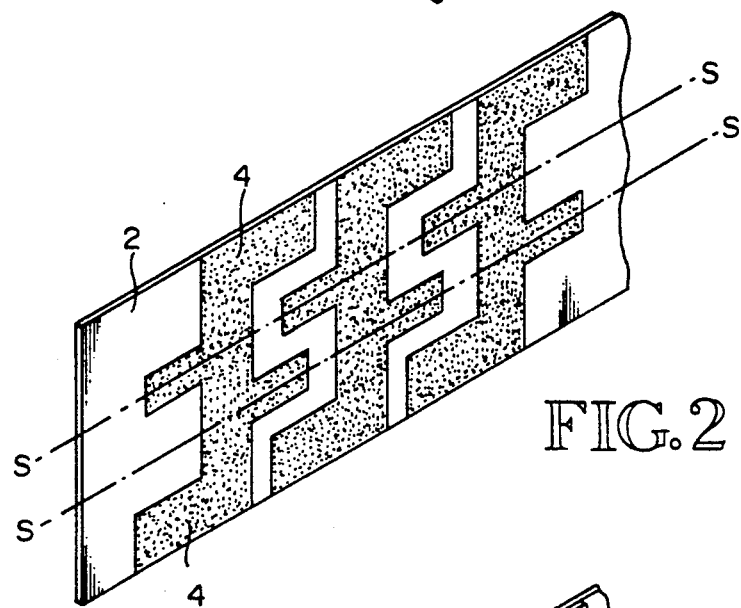
FIG. 2 is a depiction of the inventive device during the manufacturing process.

As seen in FIG. 1, a coil, fabricated using the inventive thermoelectric generator and method of manufacture, is bonded to a suitable film element 2, such that the device maintains its integrity while permitting a configuration of a closely wound coil or the like. As seen in this view, the thermoelectric device includes a predetermined number of copper elements 4 in the shape of a squared "S" wherein the elements are placed in a side-by-side series and the upper extension of one element overlies the lower extension of the adjacent element, such that a pair of adjacent elements 4 can be joined by a nickel element 8 extending between and overlapping the extensions. The pattern is repeated until a thermoelectric device of a predetermined length is formed to generate a predetermined amount of electricity. The length of the strip determines the number of elements in series and therefore the amount of electricity generated.

In the manufacturing process, a coil of copper foil of a width sufficient to form two or more ribbons of the thermoelectric device has a pattern printed thereon with an ink that resists both plating and etching solutions. Both sides are printed simultaneously in order to achieve perfect registration between the two faces. The printed copper is then subjected to a tunnel of infrared heaters to cure the ink, and a temporary mask of tape is applied to the side which will not be receiving a nickel plating. The material is next cleaned and subjected to a nickel strike which is a preplate giving the plate a better surface to adhere, and hence a better quality deposit and subsequently plated with nickel according to a predetermined pattern. An adhesive film, such as polyester or polyamide, is applied to the side opposite the tape and the tape removed. The film provides the insulation necessary between the coil layers as well as proving the structural integrity of the ribbon. The material is then chemically etched from the side that had the masking tape and due to the unique pattern of the ink resist and the registration of the two sides, the elemental leg-spacing is achieved as well as their respective junctions, i.e., copper is etched from the side opposite the nickel plate, and it is etched down to the nickel as well as through the copper between the elemental legs. The material is now ready to be slit to their respective sizes and the slitting enables many ribbons of various sizes to be manufactured simultaneously making only one run to produce dozens of ribbons. This slitting apparatus produces no scrap pieces, and all the parts are utilized as individual generators. Each individual ribbon is then coiled and can be used as a coil or it can be cut to a predetermined length for the particular application.

Figure 3:
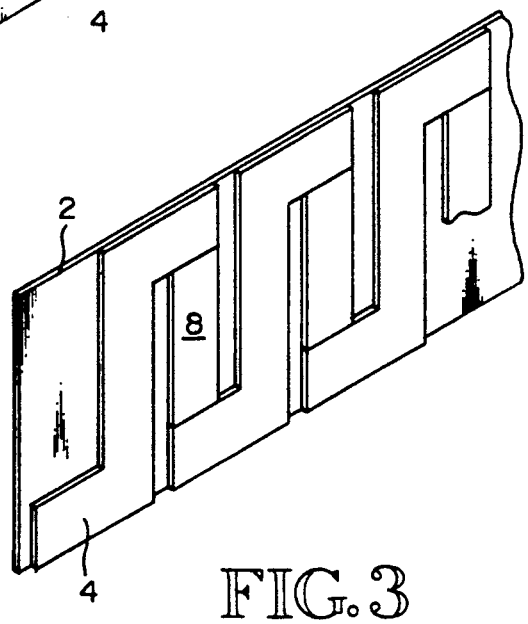
FIG. 3 is the inventive thermoelectric device at its completed stage.

In FIG. 3, it can be seen that the backing film 2 has the copper "S" form 4 interjoined by the nickel strip 8 in the series which is then capable of being coiled as shown in FIG. 1.

Figure 4:
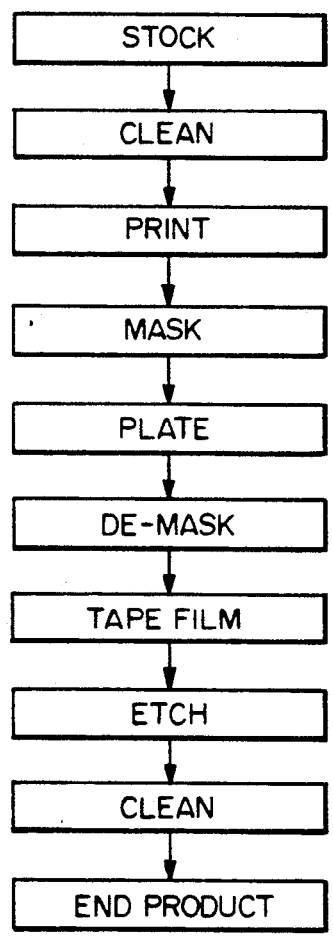
FIG. 4 is a block diagram setting forth the steps in the manufacture of the present invention.

The process by which the present invention is fabricated is illustrated by the diagram of FIG. 4, wherein the steps incorporated include providing a copper stock which is printed with the desired configuration, the parts that are not to be plated with nickel are masked, the nickel is plated upon the device, and it is then demasked, and the combination strip is applied to a flexible carrying member. The copper is then etched off the appropriate places and placed into the end configuration.

Thus as can be seen, the present invention contemplates a rapid and relatively simple method of manufacturing a highly sensitive and efficient thermoelectric generator.

We claim:

1. The method of forming a thermoelectric generator comprising the steps of:
   simultaneously applying a mask of a predetermined configuration to both sides of a base metal;
   temporarily covering one side of the masked base metal and plating the opposite side with a metal dissimilar from the base metal, producing a molecular bond with the base metal;
   removing the temporary cover and insulating the now-plated side;
   etching the base metal from the unmasked areas through to the plated metal and insulation; and
   slitting the material resultant from the previous steps to a predetermined size and form, thus producing a more direct access to metallic junctions formed by the previous steps by a heat source.

* * * * *